United States Patent [19]

Shaheen

[11] 3,955,068
[45] May 4, 1976

[54] FLEXIBLE CONDUCTOR-RESISTOR COMPOSITE

[75] Inventor: Joseph M. Shaheen, La Habra, Calif.

[73] Assignee: Rockwell International Corporation, El Segundo, Calif.

[22] Filed: Sept. 27, 1974

[21] Appl. No.: 509,883

[52] U.S. Cl. ............................ 219/549; 29/620; 219/216; 427/126
[51] Int. Cl.² ........................................ H05B 3/16
[58] Field of Search ............... 219/543, 549, 216; 338/306–309, 210; 346/76 R; 29/610, 611, 620; 357/56; 427/123, 124, 126

[56] References Cited
UNITED STATES PATENTS

| | | | |
|---|---|---|---|
| 3,308,528 | 3/1967 | Bullard et al. | 338/309 X |
| 3,368,919 | 2/1968 | Casale et al. | 338/309 X |
| 3,495,070 | 2/1970 | Zissen | 219/543 X |
| 3,515,850 | 6/1970 | Cady, Jr. | 219/543 X |

Primary Examiner—C. L. Albritton
Attorney, Agent, or Firm—H. Fredrick Hamann; G. Donald Weber, Jr.; Gilbert H. Friedman

[57] ABSTRACT

A composite comprising a flexible substrate structure including a base and support members projecting therefrom; a network of resistor segments; a conductor network interposed between the resistor network and the base of the substrate structure for cooperating with the projecting support members of the substrate structure to support the resistor segments and for supplying power to the resistor segments; and, a backup board affixed to the substrate on the side thereof opposite the resistor segments. The composite can be used, e.g., as the printing element in thermal print heads. The resistor network can be formed on top of the conductor network by casting the flexible projecting support members on the base between the conductors flush with the outer surfaces of the conductors for supporting the resistor network thereon. Alternatively, the projecting support members and the base can be formed as one piece.

8 Claims, 23 Drawing Figures

START: FLEXIBLE BASE OR SHEET 25

1. DEPOSIT METALLIC LAYER 28 (e.g., COPPER)

2. APPLY PHOTORESIST AND ETCH CONDUCTOR NETWORK 22

3. FORM FLEXIBLE MEMBERS 29 FLUSH WITH CONDUCTORS 23

4. MOUNT BACK-UP BOARD 27

5. FORM RESISTOR LAYER 33 (e.g., CERMET)

6. APPLY PHOTORESIST AND ETCH RESISTOR NETWORK 24

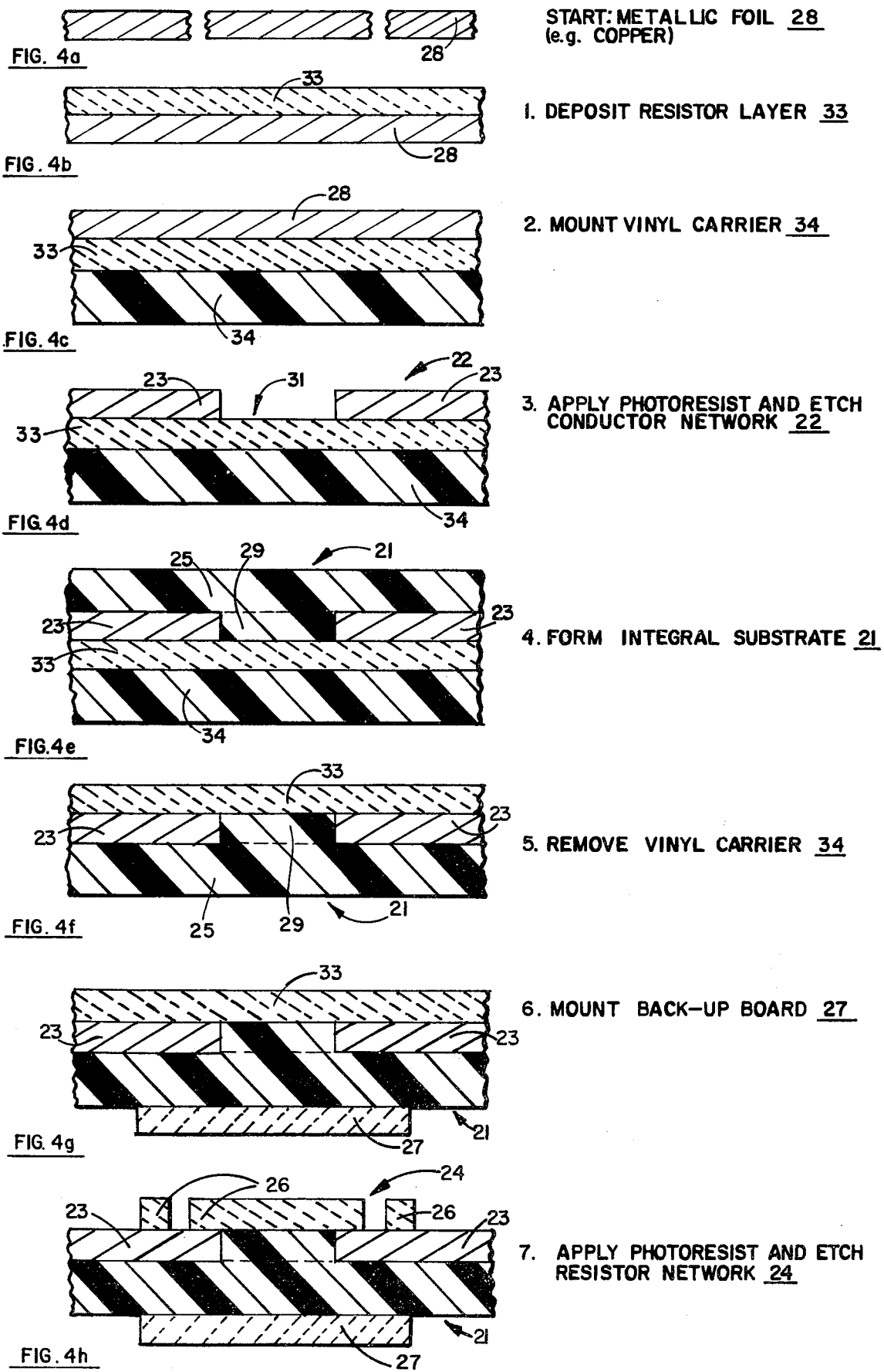

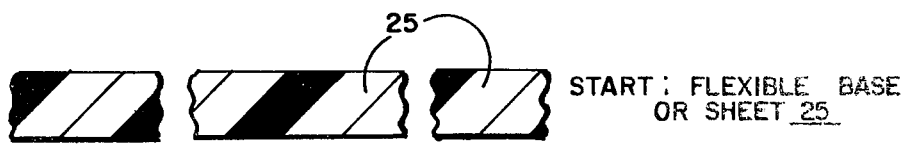
FIG. 5a  START: FLEXIBLE BASE OR SHEET 25
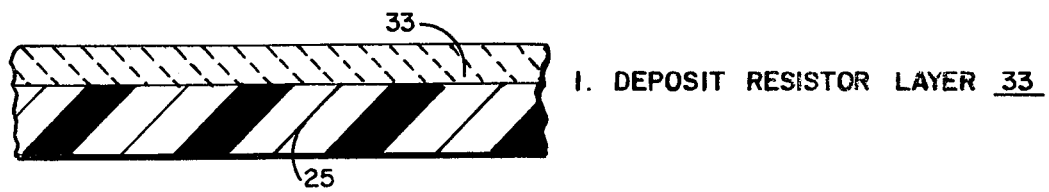
FIG. 5b  1. DEPOSIT RESISTOR LAYER 33
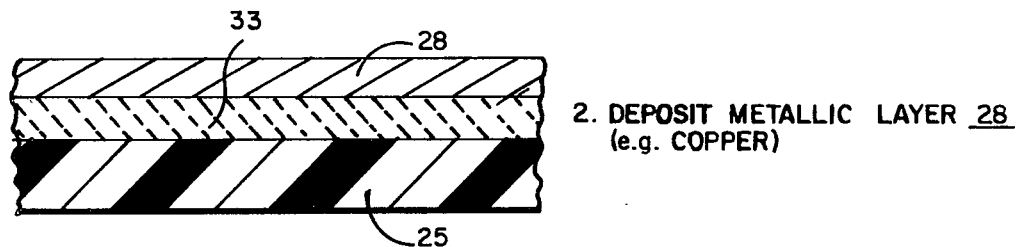
FIG. 5c  2. DEPOSIT METALLIC LAYER 28 (e.g. COPPER)
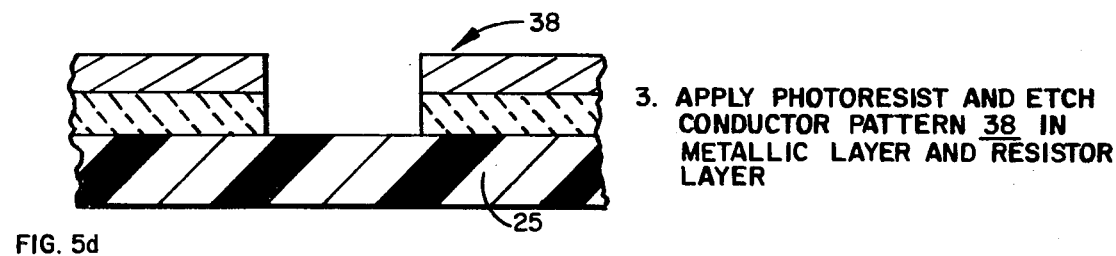
FIG. 5d  3. APPLY PHOTORESIST AND ETCH CONDUCTOR PATTERN 38 IN METALLIC LAYER AND RESISTOR LAYER
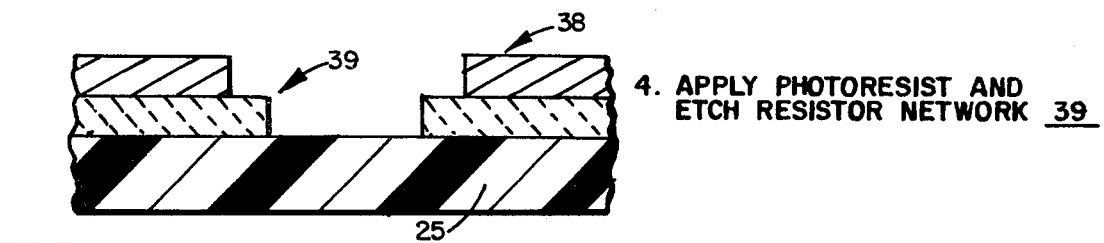
FIG. 5e  4. APPLY PHOTORESIST AND ETCH RESISTOR NETWORK 39
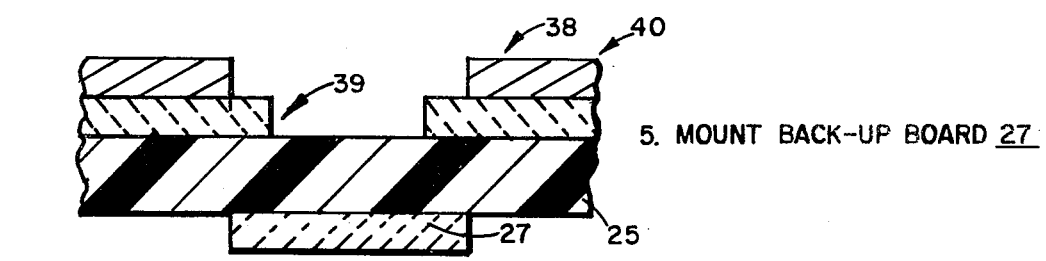
FIG. 5f  5. MOUNT BACK-UP BOARD 27

FLEXIBLE CONDUCTOR-RESISTOR COMPOSITE

BACKGROUND OF THE INVENTION

1. Field of the Invention

This invention relates to thermal printing heads and, more particularly, to substrate-supported thermal printing elements.

2. Description of Prior Art

Referring to FIG. 1, there is shown a schematic representation, in cross-section, of a typical thermal printing element 10 which is known in the art. The element 10 comprises a substrate 11 typically of glass or other rigid, thermally insulating material; a resistor layer 12, typically of cermet, supported by the substrate; and a metallic layer 13 of conductors supported by the resistor layer 12. The element 10 can be formed by sputtering a layer 12 of cermet on a glass substrate 11, sputtering a layer 13 of copper on the cermet layer 12, etching a composite resistor-conductor pattern through the conductor and cermet layers, and then etching the conductor layer 13 to remove the copper from areas of the cermet layer 12. This leaves exposed, recessed cermet resistor segments 14 which form the operating portion of the thermal print element 10. As will be appreciated by those skilled in the art, the conductor layer 13 substantially eliminates $I^2R$ heating of those portions of the resistor layer 12 disposed thereunder, but supplies current through the exposed resistor segments 14 to heat the exposed resistors. FIG. 1 is merely illustrative of a typical cross-section and does not show the many possible configurations for the resistor segments 14 nor the electrical connections which are used to complete current paths through the resistor segments.

The conductors of layer 13 typically have a thickness of about 15,000 A. As a result, the resistors 14 are recessed 15,000 A relative to the conductors and are separated from the recording medium, such as thermal printing paper, (not shown) by at least the same distance. Consequently, the printing paper must be brought into contact with the resistors 14, typically by rollers which back the paper. The small openings between the conductors make this difficult.

In addition, the conductors formed in layer 13 must be aligned with and connected to external electrical leads (not shown) which supply the current to the resistors 14 via the conductors. Of course, the alignment and the use of clamps or other means to mount the external leads to the conductors adds to the cost of manufacturing. In addition, the clamps or other holding means may overlap onto the printing paper, requiring additional movement of the paper in order to read the printing.

As may be appreciated, it is highly desirable to have a resistor structure which will eliminate problems such as the above-described problems of printing, aligning, mounting and reading.

BRIEF DESCRIPTION OF THE DRAWINGS

FIGS. 4a–4h show the sequence of major steps for forming the structure of FIG. 2 according to an alternative method.

FIGS. 5a–5f show the major steps for making a conductor-resistor composite which embodies several features of the present invention.

SUMMARY OF THE INVENTION

A flexible resistor-conductor composite for thermal printing elements comprises a flexible substrate structure, including a base and members projecting therefrom; a network of resistors supported by the substrate; a network of conductors formed on the base which conductors supply current to the resistors and, with the projecting members, support the resistor network; and a backup board affixed to the base on the opposite side thereof from the resistors for providing rigidity to the flexible substrate at the resistor network. A preferred method for making the composite includes the steps of forming the network of conductors on the flexible base and forming the flexible, projecting members between the conductors flush with the outer surfaces of the conductors; then forming the resistor network on the conductor network and on the projecting members opposite the backup board.

DETAILED DESCRIPTION OF A PREFERRED EMBODIMENT

Figure 2:
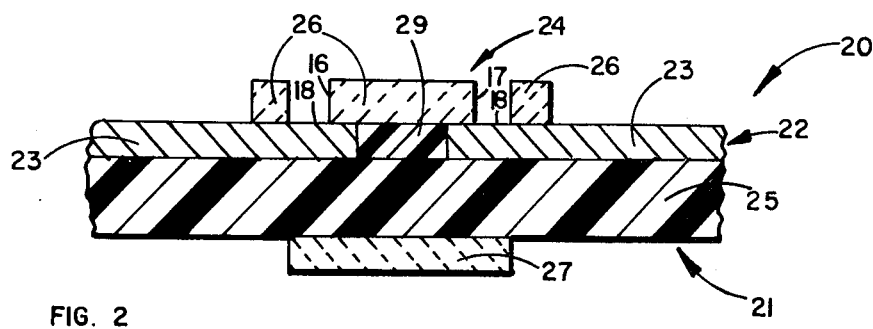
FIG. 2 is a schematic representation, in cross-section, of a flexible conductor-resistor composite embodying the principles of the present invention.

Referring to FIG. 2, there is shown a schematic representation, in cross-section, of a flexible conductor-resistor composite 20 which embodies the principles of the present invention. The composite 20 comprises a flexible substrate structure 21 of material such as polyimide, or polyimide amide, a network 22 of conductors 23 supported by a base portion 25 of the substrate, and a network 24 of resistor segments 26. Ends 16 and 17 of the resistor segments 26 are supported by and are in electrical contact with first end portions 18 of the conductors 23. A rigid backup board 27 is affixed to the substrate 25 on the side thereof opposite the resistor segments for maintaining the alignment of the resistor segments (preventing deformation thereof during printing. Projecting substrate portions or members 29 (only one is shown) support the resistor segments 26 intermediate the ends thereof.

Those skilled in the art will appreciate that various configurations are possible for the resistor network 24. For example, FIG. 2 shows an end view of a figure eight configuration of resistor segments 26. In this view only the length of the center one of the three visible resistor segments 26 lies in the plane of the figure. The outer resistor segments 26 are at right angles to the plane of the figure. Only the center resistor segment is shown to be connected to separate conductors 23 and to be supported intermediate the conductors by the projecting member 29. The outer resistor segments are electrically connected and supported in a similar manner.

The use of the flexible substrate 21-conductor 23 composite permits combining the conductor interconnections 13 (FIG. 1) and the external leads (not shown) of the prior art into a single structure. That is, the substrate 21-conductor 23 composite is used to support the resistor network 24. In addition, the flexible substrate base 25 and the conductor 23 portion of the composite can be made of sufficient length, as required, to connect directly via second end portions (not shown), to the circuitry or source that supplies power to the resistor segments 26. In other words, because of the flexibility of the composite 20, the conductors 23 can be of sufficient length to function both as resistor connectors and as power leads, thus eliminating the prior art requirement for external power leads. This arrangement also eliminates the previously mentioned problems of aligning and mounting the external leads. As will be noted by comparing FIGS. 1 and 2, the resistor segments 26 of the present invention protrude above the conductors 23 rather than being recessed. As a result, the previously mentioned printing problems are eliminated.

Referring now to FIGS 3a –3g, the major steps used to manufacture the conductor-resistor composite 20 are shown in chronological sequence. When the composite 20 is to be used in thermal printing applications, a flexible polyimide sheet or base 25 (FIG. 3a) of about 0.002 inches thickness can be used. In the first step of the process (FIG. 3b), a copper layer 28 is formed on the flexible base 25. This may be done using techniques which are well known in the art. To illustrate, the base 25 of 0.002 inches thickness can be laminated to the copper layer 28 using temperature and pressure parameters such as 350°F and 150 psi. In step 2 (FIG. 3c), the copper layer 28 is formed into the desired conductors lead network 22 of the conductor 23. Typically, this is done by etching through a photoresist mask.

In step 3 (FIG. 3d), flexible, projecting members 29 of material such as polyimide amide or polyimide are formed on the base 25 in etched areas 31 (FIG. 3c) of the copper layer 23. The upper surfaces of members 29 are made flush with upper surfaces 32 of the copper. When polyimide amide (or polyimide) is used, the projecting members 29 may be formed by casting and, if necessary, by sanding the polyimide amide flush with surface 32. This step provides a substantially continuous surface for supporting the protruding resistors 26 as shown in FIG. 2, i.e., provides conductors which are interposed between the base 25 and the resistors 26, while at the same time providing support for the resistors intermediate the ends 16 and 17 thereof without shorting the conductors.

Figure 3A:
FIGS. 3a–3g show the sequence of major steps of a preferred method for making the conductor-resistor composite of FIG. 2.
Figure 3B:
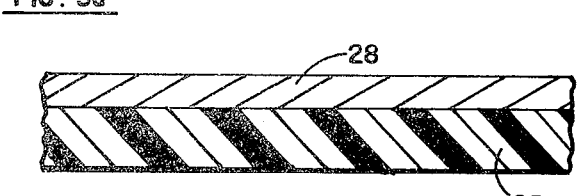
Figure 3C:
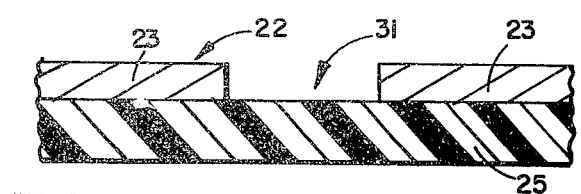
Figure 3D:
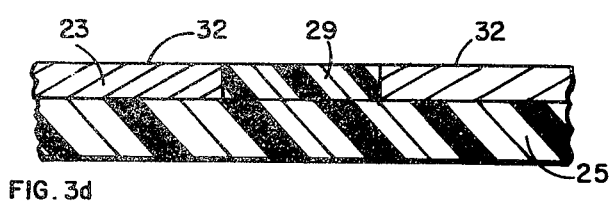
Figure 3E:
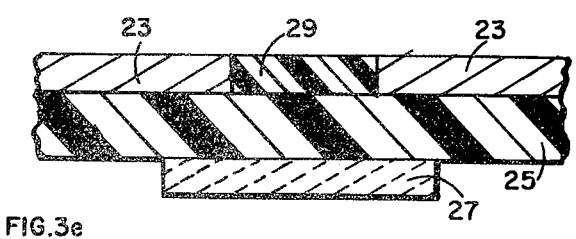

As shown in FIG. 3e, in step 4, the rigid backup board 27, typically of metal, glass or ceramic, is affixed to the flexible base 25 on the side thereof opposite the resistor area. As stated previously, the backup board 27 supplied rigidity to the area of the base supporting the resistors. The backup board 27 can also be of high thermal conductivity to act as a heat sink for the resistor network 24.

Figure 3F:
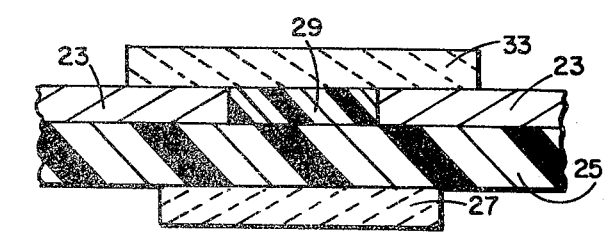
Figure 3G:
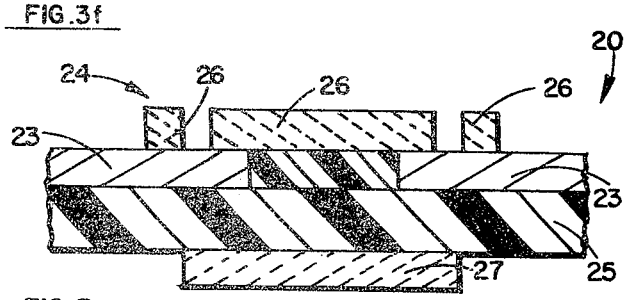

Referring to FIG. 3f, in step 5, a layer 33 of resistor material is formed on the substantially flush surfaces of conductors 23 and the projecting substrate members 29. An excellent resistor material is a 90 percent chrome—10 percent silicon oxide, cermet composition. However, the invention is not limited to this illustrative material. The resistor layer 33 can be deposited using any of several techniques, such as vacuum deposition, which are known in the art.

Finally, in step 6 (FIG. 3g), the layer 33 is formed into the segments 26 of the resistor network 24, thereby providing the completed conductor-resistor composite 20 shown in FIG. 2. The resistor network 24 can be formed using various techniques, such as etching through a photoresist mask.

Referring now to FIGS. 4a –4h, there is shown an alternative process for forming a composite which is essentially identical to the composite structure 20 of FIG. 2. Here, in the initial step (FIG. 4b), the resistor layer 33 is formed on the metallic layer 28, (FIG. 4a) which can be in the form of flexible copper foil. Next, as shown in FIG. 4c, carrier 34 (typically polyvinyl chloride film) is mounted or formed on the opposite side of the resistor layer 33 from the copper. This can be done using lamination or other techniques which are known to those skilled in the art.

In step 3 (FIG. 4d), the copper layer 28 is formed into a conductor pattern, i.e., connector-lead network 22, in the manner of step 2 (FIG. 3c) of the previously described embodiment of the process. Areas 31 are etched away during this step. As shown in FIG. 4e, in step 4, flexible substrate structure 21 of material such as polyimide is laminated to the conductors 23 and fills in the etched areas 31 (FIG. 4d) between the conductors. Thus, the flexible base 25 and the projecting members 29 are affixed to the conductors and resistors using a single processing step.

It will be noted that, using the alternative process which is delineated in FIGS. 4a –4h, the flexible substrate structure 21 can be of one piece or the flexible base 25 can be affixed to the conductors 23 using an adhesive that fills in the etched areas 31, thereby providing support members 29. Regardless of the process, materials such as polyimide or polyimide-amide can be used for the base 25, the projecting members 29, or the one piece substrate structure 21. When processability is important, e.g., when the separate base 25 and support member 29 are used, polyimide-amide is a preferred material for its adhesive qualities. Polyimide is a preferred material when temperature resistance is the more important criterion.

In step 5 (FIG. 4f), the carrier 34 is removed. When vinyl is used, the carrier may be removed by peeling it away from the composite.

In steps 6 and 7, respectively, the rigid backup board 27 is affixed to the flexible substrate structure 21 (FIG. 4g) and the resistor network 24 is formed (FIG. 4h), thereby essentially duplicating the conductor-resistor composite 20 of FIG. 2.

Figure 1:
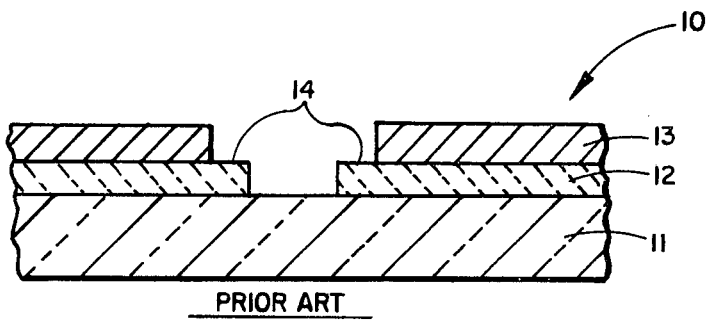
FIG. 1 is a schematic representation, in cross-section, of a thermal printing element known in the art.

In the event contact between the resistor network 24 and the printing paper (not shown) is not a problem, e.g., because a large resistor network surface area can be used, a flexible substrate conductor arrangement can be applied to the recessed resistor arrangement shown in FIG. 1. Starting with the flexible base or sheet 25 (FIG. 5a), in step 1 (FIG. 5b), the resistor layer 33 is formed on the base. Then, pursuant to step 2 (FIG. 5c), the copper layer 28 is formed on the resistor layer and, in step 3 (FIG. 5d), a conductor pattern 38 is formed in both the copper layer 28 and in the resistor layer 33. Next, according to step 4 (FIG. 5e), the underlying resistor layer 33 is formed into a resistor network 39. Finally, in step 5 (FIG. 5f), the backup board 27 is mounted to the flexible base 25 opposite the resistor network 39.

As shown in FIG. 5f, the resulting composite 40 is similar to the composite 20 of the present invention in that a flexible base and a backup board are used, and in permitting combining the connectors and the external leads, but has features of the prior art thermal printing element 10 in that the resistor network 39 is recessed relative to the conductor network 38. The structure has several of the advantages of the composite 20, and may be formed in a relatively few steps.

It should be noted that additional copper can be plated on the connector and/or the lead portions of the conductor network to adjust conductivity.

Thus, there has been described an integral, flexible conductor-resistor composite having application, for example, in thermal printers. Alternative composites and alternative processes for forming the conductor-resistor composites have been described. This is not limiting, however, for the scope of the invention is limited only by the claims appended hereto and equivalents thereof.

Having thus described the preferred embodiments of the invention, what is claimed is:

1. A conductor-resistor composite comprising:
    a base of a first flexible insulative material, said base having a first region and a second region;
    at least one resistor element, said resistor element having an intermediate portion disposed above said second ragion of said base, said resistor element further having first and second ends disposed above said first region of said base;
    a plurality of conductors supported on said first region of said base, at least two of said conductors being interposed between said base and said first and second ends, respectively, of said resistor element and in electrical contact with said first and second ends, respectively, of said resistor element;
    at least one insulative support member of a second flexible insulative material projecting from said second region of said base interposed between said intermediate portion of said resistor element and said base for supporting said resistor element intermediate said first and second ends thereof.

2. A composite as defined in claim 1 wherein said first flexible insulative material is selected from polyimide and polyimide-amide.

3. A composite as defined in claim 1 wherein said base and said insulative support member comprise an integral substrate structure wherein said first flexible insulative material and said second flexible insulative material are the same material selected from polyimide and polyimide-amide.

4. A composite as defined in claim 1 wherein said resistor element is cermet.

5. A composite as defined in claim 1 wherein said second flexible insulative material is selected from polyimide and polyimide-amide.

6. A composite as defined in claim 1 including a rigid support member affixed to said base on the opposite side of said base from said resistor element and opposite said resistor element.

7. A composite as defined in claim 1 wherein said composite comprises a thermal print element.

8. A composite comprising:
    a base member of flexible electrically insulative material,
    at least two electrical conductors supported by said base member,
    a support member of flexible electrically insulative material projecting from said base and interposed between said conductors; and
    at least one resistor element, said resistor element having an intermediate portion supported by said support member, said resistor element having first and second ends disposed above and in electrical contact with said electrical conductors.

* * * * *